United States Patent
Higashi et al.

(10) Patent No.: US 11,530,794 B2
(45) Date of Patent: Dec. 20, 2022

(54) LIGHTING DEVICE FOR A VEHICLE AND VEHICLE

(71) Applicant: KYOCERA Corporation, Kyoto (JP)

(72) Inventors: Toshifumi Higashi, Kirishima (JP); Youji Furukubo, Kirishima (JP); Takafumi Yamaguchi, Kirishima (JP); Yuji Iino, Shibushi (JP)

(73) Assignee: KYOCERA CORPORATION, Kyoto (JP)

( * ) Notice: Subject to any disclaimer, the term of this patent is extended or adjusted under 35 U.S.C. 154(b) by 0 days.

(21) Appl. No.: 17/299,163

(22) PCT Filed: Dec. 4, 2019

(86) PCT No.: PCT/JP2019/047325
§ 371 (c)(1),
(2) Date: Jun. 2, 2021

(87) PCT Pub. No.: WO2020/116489
PCT Pub. Date: Jun. 11, 2020

(65) Prior Publication Data
US 2022/0034475 A1    Feb. 3, 2022

(30) Foreign Application Priority Data
Dec. 6, 2018    (JP) .............................. JP2018-229458

(51) Int. Cl.
*F21S 45/43*    (2018.01)
*F21S 45/48*    (2018.01)
*F21S 41/148*   (2018.01)

(52) U.S. Cl.
CPC ............. *F21S 45/43* (2018.01); *F21S 41/148* (2018.01); *F21S 45/48* (2018.01)

(58) Field of Classification Search
CPC ........... F21S 45/43; F21S 45/48; F21S 41/148
See application file for complete search history.

(56) References Cited

U.S. PATENT DOCUMENTS

| | | |
|---|---|---|
| 2003/0122704 A1 | 7/2003 | Dubrovin |
| 2010/0128479 A1 | 5/2010 | Biebl et al. |
| 2016/0186957 A1 | 6/2016 | Lewerich et al. |
| 2016/0268770 A1 | 9/2016 | Tazawa et al. |
| 2018/0145478 A1 | 5/2018 | Sakai et al. |
| 2019/0283658 A1* | 9/2019 | Furui .................... G01S 17/931 |

FOREIGN PATENT DOCUMENTS

| | | |
|---|---|---|
| DE | 102013216869 A1 | 2/2015 |
| EP | 1323570 A1 | 7/2003 |
| EP | 2952383 A1 | 12/2015 |

(Continued)

*Primary Examiner* — Thomas M Sember
(74) *Attorney, Agent, or Firm* — Volpe Koenig

(57) ABSTRACT

A lighting device for a vehicle includes a lighting device body that has a light source part and a housing body that supports the light source part, and a ventilation part-adjacent to the lighting device body and through which outside wind passes. The light source part has a light source element part that emits light and a heat release member that releases heat that is generated in the light source element part. The light source element part is inside of the housing body and the heat release member is exposed inside of the ventilation part.

8 Claims, 6 Drawing Sheets

(56) References Cited

FOREIGN PATENT DOCUMENTS

| | | | |
|---|---|---|---|
| JP | 2009-266573 | A | 11/2009 |
| JP | 2010-524210 | A | 7/2010 |
| JP | 2014-026769 | A | 2/2014 |
| JP | 2016-207363 | A | 12/2016 |
| JP | 2017-041366 | A | 2/2017 |
| JP | 2017-062885 | A | 3/2017 |
| JP | 2018-026262 | A | 2/2018 |
| JP | 2018-098087 | A | 6/2018 |
| JP | 2018-182268 | A | 11/2018 |

* cited by examiner

LIGHTING DEVICE FOR A VEHICLE AND VEHICLE

CROSS-REFERENCE TO RELATED APPLICATION(S)

This application is a national stage application of International Application No. PCT/JP2019/047325, filed on Dec. 4, 2019, which designates the United States, the entire contents of which are herein incorporated by reference, and which is based upon and claims the benefit of priority to Japanese Patent Application No. 2018-229458, filed on Dec. 6, 2018, the entire contents of which are herein incorporated by reference.

FIELD

A disclosed embodiment(s) relate(s) to a lighting device for a vehicle and a vehicle.

BACKGROUND

A lighting device for a vehicle has conventionally been known that includes a light source part, a heat release member that releases heat that is generated in such a light source part, and a blower device that rotates a fan to blow wind to the heat release member (see, for example, Patent Literature 1).

CITATION LIST

Patent Literature

Patent Literature 1: Japanese Patent Application Publication No. 2017-062885

SUMMARY

A lighting device for a vehicle according to an aspect of an embodiment includes a lighting device body that has a light source part and a housing body that supports the light source part, and a ventilation part that is provided to be adjacent to the lighting device body and passes wind from an outside therethrough. The light source part has a light source element part that emits light and a heat release member that releases heat that is generated in the light source element part. The light source element part is provided on an inside of the housing body, and the heat release member is provided to be exposed to an inside of the ventilation part.

Furthermore, a vehicle according to an aspect of an embodiment includes the lighting device for a vehicle as described above.

DESCRIPTION OF EMBODIMENTS

An aspect of an embodiment aims to provide a lighting device for a vehicle and a vehicle that are capable of reducing an amount of consumption of electric power that is stored in the vehicle. Hereinafter, an embodiment(s) of a lighting device for a vehicle and a vehicle as disclosed in the present application will be explained with reference to the accompanying drawing(s).

Vehicle

Figure 1:
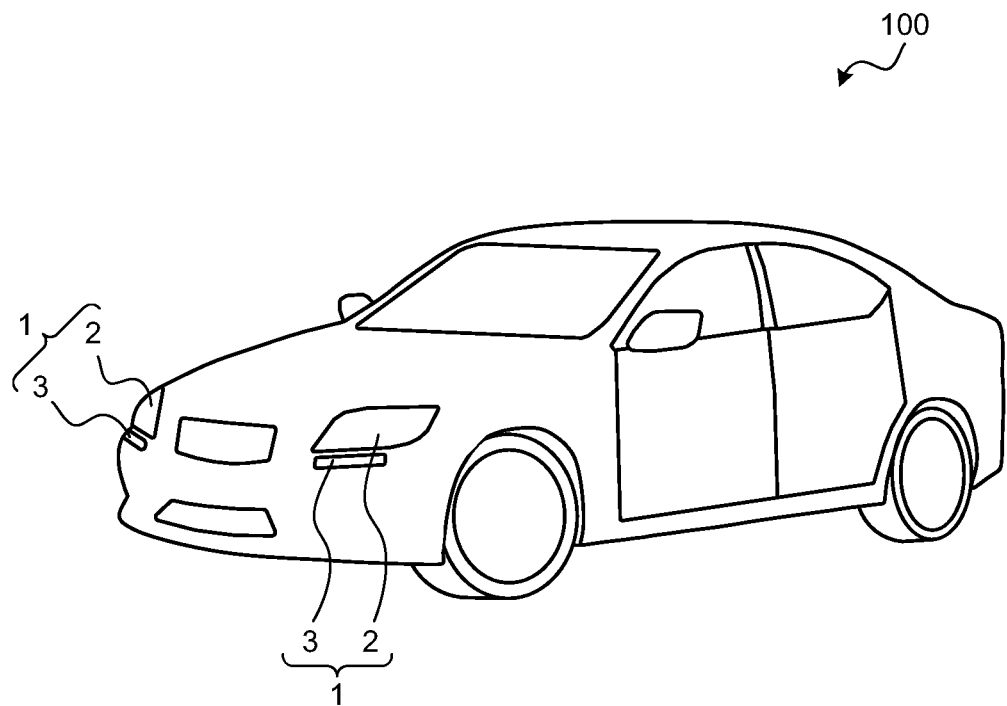
FIG. 1 is a perspective view of a vehicle according to an embodiment.

First, an outline of a vehicle 100 according to an embodiment will be explained with reference to FIG. 1. As illustrated in FIG. 1, the vehicle 100 according to an embodiment is, for example, an automobile that includes four wheels or tires. Such a vehicle 100 is provided with a pair of lighting devices for a vehicle 1 on a front side thereof.

Then, such a pair of lighting devices for a vehicle 1 is operated, so that it is possible to illuminate a direction of travel of the vehicle 100. Such a lighting device for a vehicle 1 includes a lighting device body 2 and a ventilation part 3. A detail of the lighting device for a vehicle 1 will be described later.

Additionally, although an automobile that includes four wheels or tires is illustrated as an example of the vehicle 100 in an example of FIG. 1, the vehicle 100 may be an automobile that includes tires that are three wheels or more than four wheels. Furthermore, the vehicle 100 is not limited to an automobile and may be a variety of movable bodies such as a bicycle, a motorcycle, a tracked vehicle such as a train, an aircraft, and/or a ship.

<Lighting Device for Vehicle>

Figure 2:
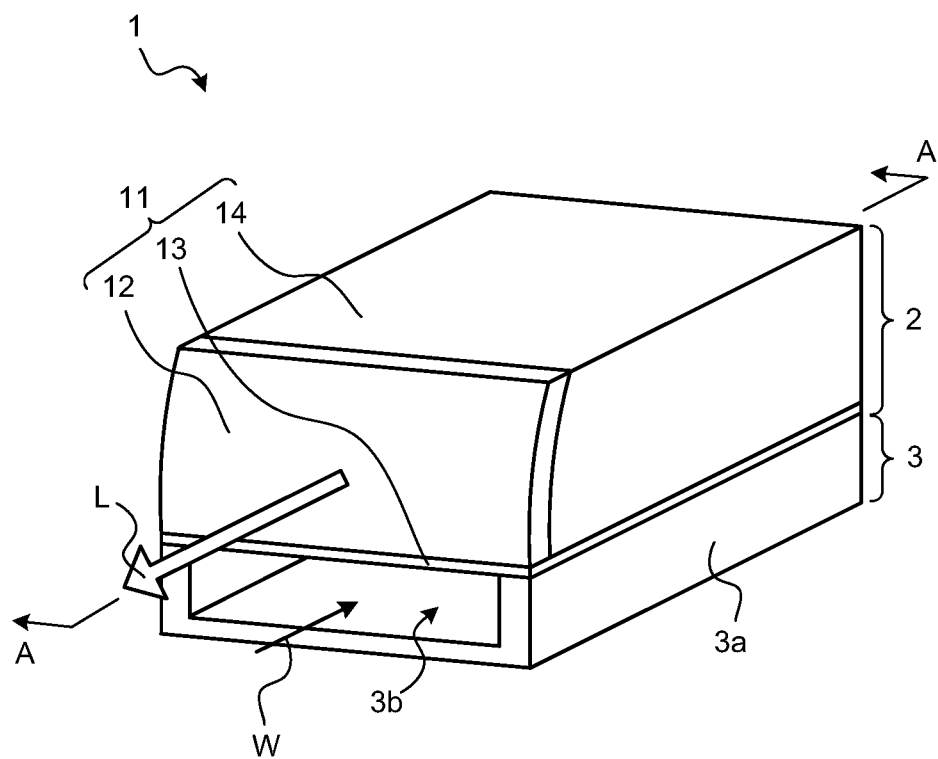
FIG. 2 is a perspective view of a lighting device for a vehicle according to an embodiment.

Next, a detail of a lighting device for a vehicle 1 according to an embodiment will be explained with reference to FIG. 2 to FIG. 5. As illustrated in FIG. 2, the lighting device for a vehicle 1 is configured in such a manner that a lighting device body 2 and a ventilation part 3 are laminated one above the other in this order. The ventilation part 3 is provided so as to be adjacent to the lighting device body 2 and a ventilation path 3b is formed in an inside thereof by a trough member 3a with a groove shape. For example, the trough member 3a is composed of an iron-based metallic material and is fixed on the lighting device body 2 by a fixation member(s) such as a bolt and/or a nut.

Figure 3:
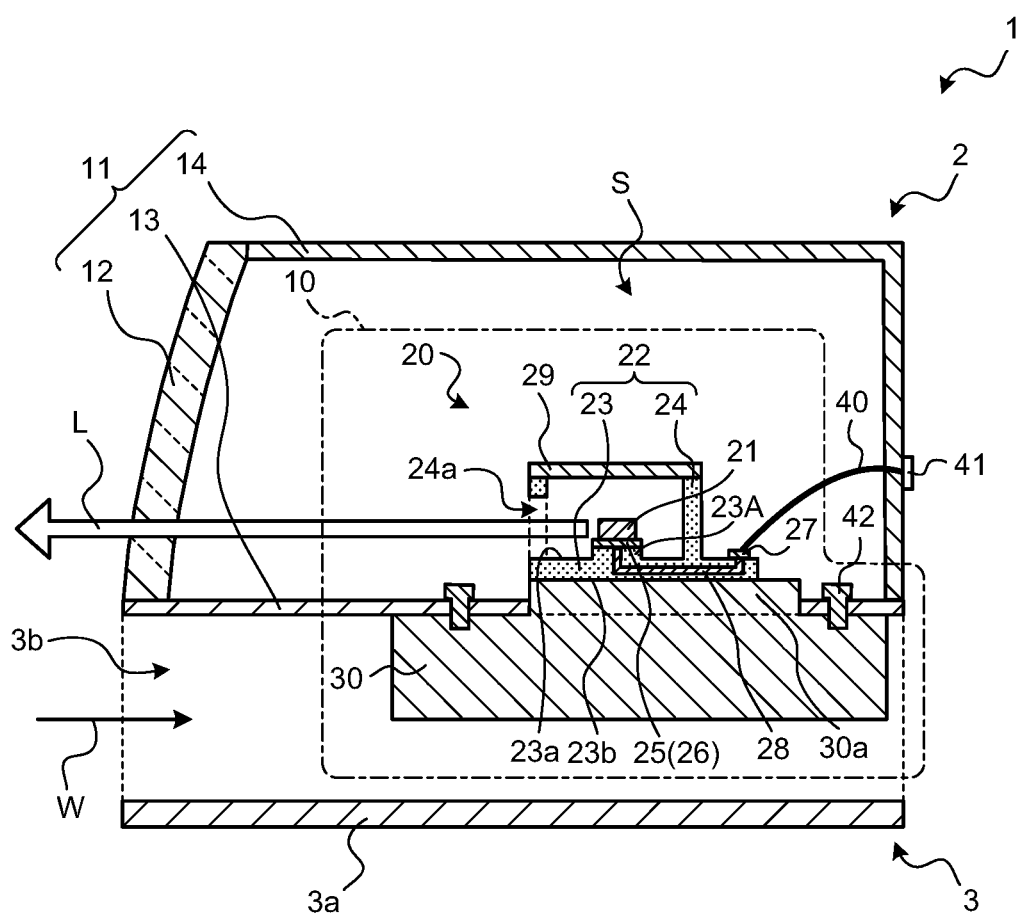
FIG. 3 is an arrow cross-sectional view along line A-A as illustrated in FIG. 2.

As illustrated in FIG. 3, the lighting device body 2 has a light source part 10 and a housing body 11. The light source part 10 that is provided in a region that is surrounded by a dashed-dotted line in FIG. 3 has a light source element part 20 and a heat release member 30. The light source element part 20 emits light L in a predetermined direction (for example, on a front side of a vehicle 100). The heat release member 30 releases heat that is generated in such a light source element part 20.

The housing body 11 has a translucent member 12, a support member 13, and a housing member 14. In such a housing body 11, the translucent member 12, the support member 13, and the housing member 14 are mutually fixed by a fixation member(s) such as a bolt and/or a nut, so that an internal space S is formed therein.

For example, the translucent member 12 is composed of a material that passes light L therethrough, such as a transparent plastic and/or glass, and is molded into a desired shape that fits the vehicle 100. For example, the support member 13 is composed of an iron-based metallic material and supports the light source part 10. For example, the housing member 14 is composed of an iron-based metallic material and forms an internal space S together with the translucent member 12 and the support member 13.

The light source element part 20 is provided on an inside of the housing body 11 (that is, the internal space S) and emits light L to an outside through the translucent member 12.

Herein, in the lighting device for a vehicle 1 according to an embodiment, the heat release member 30 that releases heat that is generated in the light source element part 20 is provided so as to be exposed to an inside of the ventilation part 3 (that is, the ventilation path 3b ). Then, it is possible for the lighting device for a vehicle 1 according to an embodiment to incorporate wind W into the ventilation path 3b of the ventilation part 3 in association with travel of the vehicle 100.

Thereby, in an embodiment, it is possible to cool the heat release member 30 efficiently by using wind W that flows through the ventilation path 3b . Therefore, according to an embodiment, electric power is not needed for cooling of the light source part 10, so that it is possible to reduce an amount of consumption of electric power that is stored in the vehicle 100.

Furthermore, in an embodiment, the light source element part 20 is provided on an inside of the housing body 11, so that it is possible to protect the light source element part 20 that is composed of an electrical component(s) from various external environments. Therefore, according to an embodiment, it is possible to improve reliability of the lighting device for a vehicle 1.

Next, a detailed configuration of the lighting device for a vehicle 1 will be explained.

As illustrated in FIG. 3, the light source element part 20 has a light-emitting element 21, a substrate for mounting an element 22, and a lid body 29. For the light-emitting element 21, it is possible to use, for example, a laser diode (that is also referred to as a semiconductor laser) or the like.

The substrate for mounting an element 22 is formed of a ceramic(s) and has a substrate part 23 with a flat plate shape and a dam part 24 that is provided on a front surface 23a of such a substrate part 23. Furthermore, a base 23A is provided on the front surface 23a of the substrate part 23. A mounting part 25 is provided on an upper surface of the base 23A and the light-emitting element 21 is mounted on such a mounting part 25.

The dam part 24 is provided so as to surround a periphery of the mounting part 25 (that is, a periphery of the light-emitting element 21) and has an opening part 24a in a direction where the light-emitting element 21 emits light L. Furthermore, a heat release member 30 is provided on a back surface 23b of the substrate part 23.

Thus, the light-emitting element 21 is mounted on the base 23A that is provided on the front surface 23a of the substrate part 23 and the heat release member 30 is provided on a side of the back surface 23b of the substrate part 23, so that it is possible to decrease a distance from the light-emitting element 21 that is a heat generation part to the heat release member 30 that is a heat release part. Therefore, according to an embodiment, it is possible to improve a heat release property of the light source part 10.

Furthermore, in an embodiment, it is preferable that a whole of the back surface 23b of the substrate part 23 contacts the heat release member 30 as illustrated in FIG. 3. Thereby, it is possible to increase an area of contact between the substrate part 23 and the heat release member 30, so that it is possible to further improve a heat release property of the light source part 10.

Furthermore, in an embodiment, it is preferable that a volume of the heat release member 30 is greater than a volume of the substrate for mounting an element 22. Thus, a volume of the heat release member 30 with a greater heat capacity is increased, so that it is possible to further improve a heat release property of the light source part 10.

Figure 4:
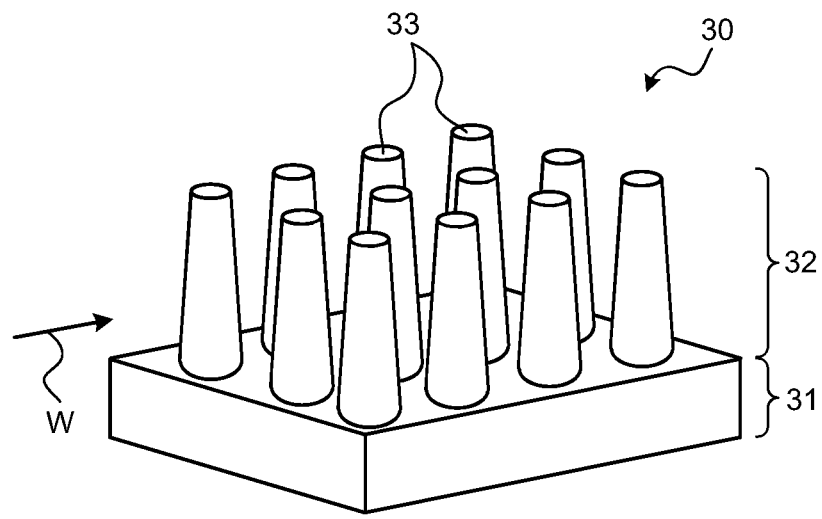
FIG. 4 is a perspective view of a heat release member according to an embodiment.
Figure 5:
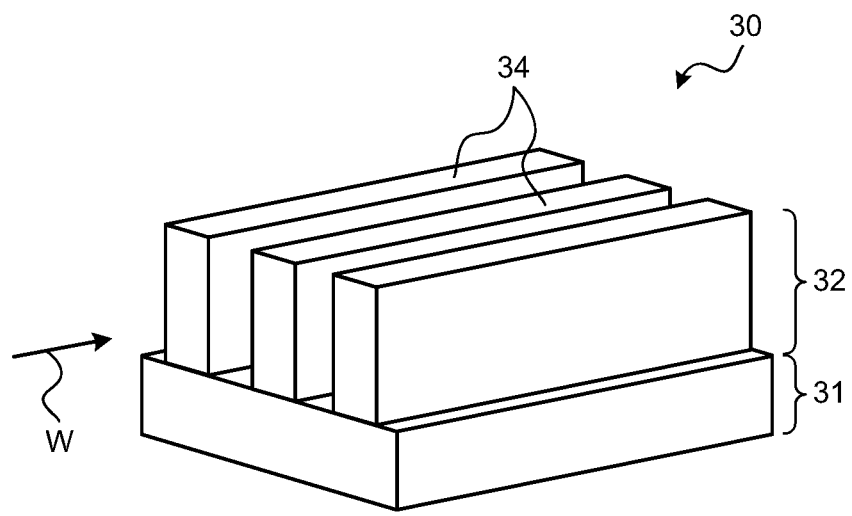
FIG. 5 is a perspective view of a heat release member according to another aspect of an embodiment.

The heat release member 30 is provided in such a manner that a metallic material(s) such as aluminum and/or copper is/are cutting-processed or cast-molded. As illustrated in FIG. 4, the heat release member 30 has a base material part 31 and a protrusion part 32. Additionally, FIG. 4 and FIG. 5 illustrate a case where the heat release member 30 is viewed from a back thereof. For example, the base material part 31 is a site that is of a plate shape that has a protrusion part 30a (see FIG. 3) and contacts the back surface 23b (see FIG. 3) of the substrate part 23.

The protrusion part 32 is provided on the base material part 31 on a side that is opposite to a side that contacts the back surface 23b of the substrate part 23. In an embodiment, it is possible for such a protrusion part 32 to increase a surface area of the heat release member 30, so that it is possible to improve a heat release property of the heat release member 30. That is, such a protrusion part 32 functions as a fin of the heat release member 30.

Additionally, the protrusion part 32 according to an embodiment may be a needle point holder type that is configured in such a manner that a plurality of columnar bodies 33 are arrayed as illustrated in FIG. 4 or may be a parallel wall type that is configured in such a manner that a plurality of wall members 34 are arrayed as illustrated in FIG. 5.

Additionally, although a case where a columnar body 33 is of a circularly cylindrical shape is illustrated in an example of FIG. 4, a shape of the columnar body 33 is not limited to a circularly cylindrical shape and may be, for example, a prismatically cylindrical shape or the like.

Furthermore, in an example of FIG. 5, it is preferable that the wall members 34 are provided on the ventilation path 3b (see FIG. 3) of the ventilation part 3 so as to be along a direction where wind W flows. Thereby, a flow of wind W on the ventilation path 3b is smooth, so that it is possible to further improve a heat release property of the heat release member 30.

Additionally, although a case where a wall member 34 is straight along a flow of wind W is illustrated in an example of FIG. 5, a shape of the wall member 34 is not limited to such a shape and may be, for example, zigzag along a direction where wind W flows. Thereby, it is possible to further increase a surface area of the wall member 34, so that it is possible to further improve a heat release property of the heat release member 30.

An explanation of FIG. 3 is returned to. For the substrate for mounting an element 22, the substrate part 23 and the dam part 24 are integrally formed of a ceramic(s). That is, in the substrate for mounting an element 22, an interface that is composed of both heterogeneous materials and causes a high thermal resistance is not provided between such a substrate part 23 and a dam part 24.

Thereby, it is possible to decrease a thermal resistance between the substrate part 23 and the dam part 24, so that it is possible to transfer heat from the substrate part 23 to the dam part 24 efficiently. Therefore, according to an embodiment, it is possible to realize the substrate for mounting an element 22 with a high heat release property.

Furthermore, for the substrate for mounting an element 22, a step of bonding such a substrate part 23 and a dam part 24 is not needed and a bonding material such as a solder is also not needed. Therefore, according to an embodiment, it is possible to realize the substrate for mounting an element 22 with a low manufacturing cost.

For a ceramic(s) that compose(s) the substrate for mounting an element 22, for example, alumina, silica, mullite, cordierite, forsterite, aluminum nitride, silicon nitride, silicon carbide, a glass ceramic(s), or the like is/are suitable. Then, for the substrate for mounting an element 22, a ceramic(s) that include(s) aluminum nitride (A1N) as a main component is/are preferable from a viewpoint(s) of a high thermal conductivity and a thermal expansion coefficient that is close to that of the light-emitting element 21.

Herein, to "include aluminum nitride as a main component" refers to the substrate for mounting an element 22 that includes 80% by mass or more of aluminum nitride. In a case where 80% by mass or more of aluminum nitride that is included in the substrate for mounting an element 22 is provided, a thermal conductivity of the substrate for mounting an element 22 is increased, so that it is possible to improve a heat release property thereof.

Moreover, the substrate for mounting an element 22 may include 90% by mass or more of aluminum nitride. As a content of aluminum nitride is 90% by mass or more, it is possible to provide a thermal conductivity of the substrate for mounting an element 22 that is 150 W/mK or greater. Then, it is possible to realize the substrate for mounting an element 22 with an excellent heat release property.

A terminal for an element 26 that is composed of a metal is provided on the mounting part 25 of the substrate for mounting an element 22. Furthermore, another terminal for an element that is not illustrated therein is provided on the front surface 23a on an inside of the damn part 24.

Moreover, a terminal for an electrical power source 27 that is composed of a metal and another terminal for an electrical power source that is not illustrated therein are provided on an outside of the dam part 24 on the front surface 23a. Herein, to "be composed of a metal" means that, for example, a ceramic(s) other than a metal may be included partially and a similar meaning will also be provided below.

The terminal for an element 26 is a terminal where the light-emitting element 21 is mounted. The light-emitting element is bonded to the terminal for an element 26 by using an electrically conductive bonding material such as Au—Sn solder. Herein, a (non-illustrated) first electrode that is provided on a lower surface of the light-emitting element 21 and the terminal for an element 26 are electrically connected by such an electrically conductive bonding material.

Thus, a lower surface of the light-emitting element 21 that is a surface with a large area and the terminal for an element 26 are bonded, so that it is possible to transfer a greater amount of heat from the light-emitting element 21 to the substrate for mounting an element 22. Therefore, according to an embodiment, it is possible to improve a heat release property of the light source part 10.

Another terminal for an element is a terminal where the light-emitting element 21 that is mounted on the terminal for an element 26 is connected by a bonding wire or the like. Herein, a (non-illustrated) second electrode that is provided on an upper surface of the light-emitting element 21 and another terminal for an element are electrically connected by such a bonding wire.

The terminal for an electrical power source 27 and another terminal for an electrical power source are terminals where an external electrical power source that is not illustrated therein is connected through a wiring 40 and an external terminal 41. Additionally, the wiring 40 is a wiring that is provided on an inside of the housing body 11 and the external terminal 41 is a terminal that is provided on the housing member 14 of the housing body 11 or the like.

Each of the terminal for an element 26, another terminal for an element, the terminal for an electrical power source 27, and another terminal for an electrical power source may be formed of a metallized film where a metallic powder is sintered. It is possible to bond each metallized film to a surface of a ceramic that composes the substrate for mounting an element 22 with a high strength, so that it is possible to realize the substrate for mounting an element 22 with high reliability.

Furthermore, a plated film of Ni or the like may be formed on a surface of such a metallized film. Moreover, solder and/or an Au—Sn plated film may be provided on a surface of such a plated film.

The terminal for an element 26 is electrically connected to the terminal for an electrical power source 27 through a wiring conductor 28 that is made of a metal and is formed in an inside of the substrate part 23. Similarly, another terminal for an element is electrically connected to another terminal for an electrical power source through another wiring conductor that is not illustrated therein, is made of a metal, and is formed in an inside of the substrate part 23,. Additionally, it is preferable that such a wiring conductor 28 and another wiring conductor are metallized films where a metallic powder is sintered.

Additionally, it is possible to obtain the substrate for mounting an element 22 according to an embodiment in such a manner that mold molded bodies that are fabricated by a mold method that executes metallic molding of a ceramic green sheet or the like are laminated so as to fabricate a laminated body and such a laminated body is fired. Additionally, it is preferable that the wiring conductor 28 that is provided on an inside of the substrate for mounting an element 22 is formed by preliminarily printing a conductor paste or the like on a ceramic green sheet.

Furthermore, in an example of FIG. 3, a protrusion part is formed on the front surface 23a of the substrate part 23 and the mounting part 25 is provided on such a protrusion part. Thereby, it is possible to prevent or reduce diffusely reflecting of light L that is emitted from the light-emitting element 21 on the front surface 23a of the substrate part 23. Therefore, according to an embodiment, it is possible to maintain a high light emission efficiency for the light source part 10.

The lid body 29 is provided so as to contact an upper end of the dam part 24 and plug an upper side of such a dam part 24. It is possible to provide the lid body 29 that is composed of a metallic material, a ceramic(s), and/or the like and it is sufficient that it is composed of, for example, kovar (an Fe—Ni—Co alloy) from a viewpoint(s) of a heat resistance and a heat release property that are high.

Furthermore, the opening part 24a of the dam part 24 is plugged by attaching a glass window that is not illustrated therein thereto by an Au—Sn solder or the like. Thus, in an embodiment, an inside of the dam part 24 is gas-tightly sealed by a glass window and the lid body 29.

For bonding of the lid body 29 and the dam part 24, it is preferable that electrical welding, an Au—Sn solder, a silver solder, and/or the like is/are used. It is possible to improve gas tightness of an inside of the dam part 24 that is sealed, by executing bonding according to such a method, so that it is possible to improve reliability of the lighting device for a vehicle 1.

The heat release member 30 has the protrusion part 30a on a side of an upper surface thereof. Such a protrusion part 30a is inserted into an opening part that is formed on the support member 13 from a side of a lower surface of the support member 13 so as to be exposed to an inside of the housing body 11. Then, the light source element part 20 is attached to the protrusion part 30a of the heat release member 30 that is exposed to an inside of the housing body 11.

Thus, in an embodiment, the substrate for mounting an element 22 is directly attached to the heat release member 30, so that, even if oscillation is caused by travel of the vehicle 100, the substrate for mounting an element 22 and the heat release member 30 move integrally.

Therefore, according to an embodiment, it is possible to prevent or reduce a positional shift between the substrate for mounting an element 22 and the heat release member 30 or the like, so that it is possible to decrease a dispersion of an emission direction of light L.

Furthermore, in an embodiment, the light source element part 20 is directly attached to the heat release member 30 without interposing the support member 13 therebetween, so that it is possible to decrease an interface that causes a high heat resistance between the light source element part 20 and the heat release member 30.

Thereby, it is possible to decrease a heat resistance between the light source element part 20 and the heat release member 30, so that it is possible to transfer heat from the light source element part 20 to the heat release member 30 efficiently. Therefore, according to an embodiment, it is possible to realize the light source part 10 with a high heat release property.

Additionally, it is preferable that the light source element part 20 and the heat release member 30 are bonded by, for example, a bonding material with a high thermal conductivity such as an Au—Sn solder, a silver solder, and/or the like. Thereby, it is possible to transfer heat from the light source element part 20 to the heat release member 30 more efficiently, so that it is possible to realize the light source part 10 with a higher heat release property.

Additionally, the light source element part 20 and the heat release member 30 may be fixed by a fixation member(s) such as a bolt and/or a nut.

Furthermore, the heat release member 30 is arranged in such a manner that a site other than the protrusion part 30a on an upper surface thereof contacts a lower surface of the support member 13. Then, the heat release member 30 and the support member 13 are fixed by a fixation member(s) 42 such as a bolt and/or a nut.

Thus, in an embodiment, the heat release member 30 is fixed on the support member 13 that is fixed on the vehicle 100, so that, even in a case where oscillation is caused by travel of the vehicle 100, it is possible to prevent or reduce shifting of a position of the heat release member 30.

<Variety of Variations>

Next, a variety of variations of an embodiment(s) will be explained with reference to FIG. 6 to FIG. 8. Additionally, in a variety of variations as described below, a component that is identical to that of an embodiment(s) as described above is provided with an identical sign so as to omit a redundant explanation(s) thereof.

Figure 6:
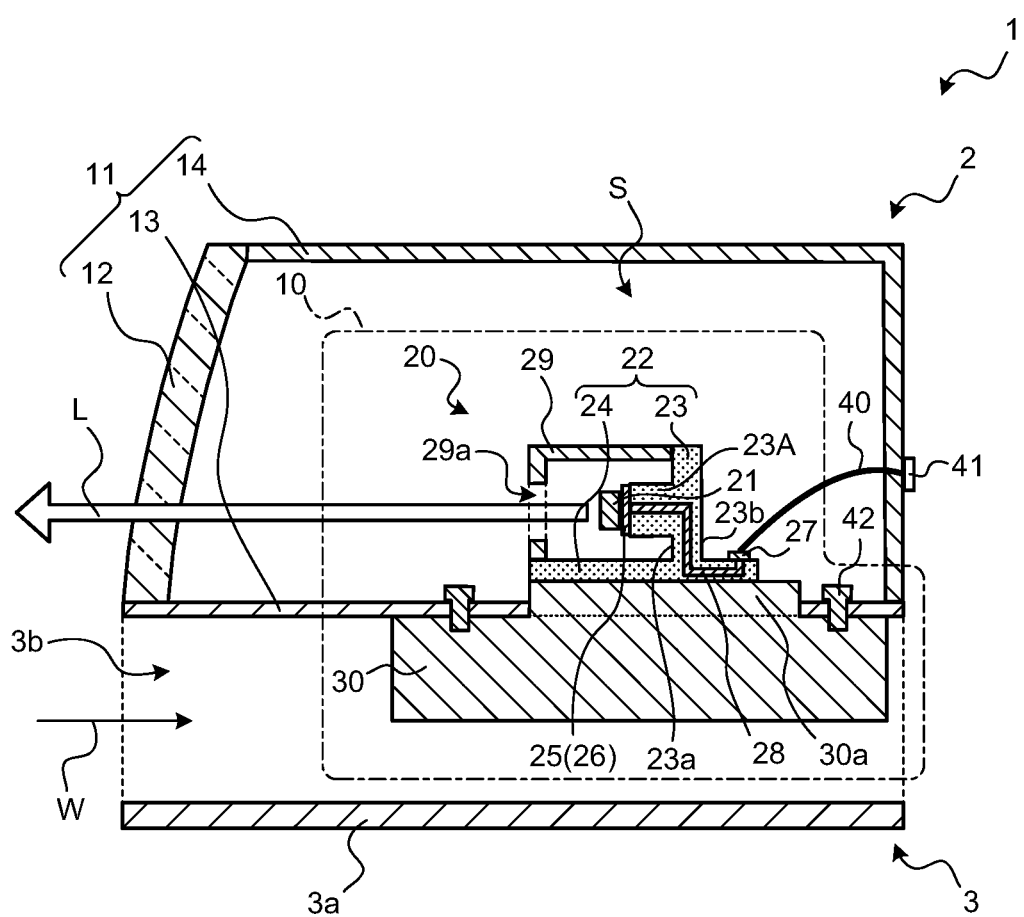
FIG. 6 is a cross-sectional view of a lighting device for a vehicle according to variation 1 of an embodiment.

FIG. 6 is a cross-sectional view of a lighting device for a vehicle 1 according to variation 1 of an embodiment. In variation 1 as illustrated in FIG. 6, structures of a substrate for mounting an element 22 and a lid body 29 are different from those of an embodiment. The substrate for mounting an element 22 according to variation 1 has a substrate part 23 and a dam part 24. In such a case, the substrate part 23 is provided so as to stand on an upper surface of a heat release member 30. A part of the dam part 24 is arranged along an upper surface of the heat release member 30.

Specifically, a mounting part 25 is provided on an upper surface of a base 23A that protrudes from a front surface 23a of the substrate part 23 toward a translucent member 12, and a light-emitting element 21 is mounted on such a mounting part 25. Furthermore, the light-emitting element 21 according to variation 1 is a light-emitting element that emits light in an upward direction, so that it is possible to emit light L from such a light-emitting element 21 toward the translucent member 12.

Also in such a case, although an orientation of the substrate part 23 is different, the light-emitting element 21 is mounted on the base 23A that is provided on the front surface 23a of the substrate part 23 and the heat release member 30 is provided on a side of a side surface of the dam part 24, so that it is possible to release heat that is generated from the light-emitting element 21 that is a heat generation part, through the dam part 24.

A terminal for an element 26 is electrically connected to a terminal for an electrical power source 27 through a wiring conductor 28 that is made of a metal and is formed in an inside of the substrate part 23 and the dam part 24. Similarly, another terminal for an element is electrically connected to another terminal for an electrical power source through another wiring conductor that is not illustrated therein, is made of a metal, and is formed in an inside of the substrate part 23 and the dam part 24.

The lid body 29 is provided so as to plug an upper side of the dam part 24 and a front side of the substrate part 23. That is, the lid body 29 in variation 1 is of a rectangular shape where three sides thereof are plugged in a cross-sectional view thereof. Furthermore, the lid body 29 has an opening part 29a in a direction where the light-emitting element 21 emits light L.

Furthermore, the opening part 29a of the lid body 29 is plugged by attaching a glass window that is not illustrated therein thereto by an Au—Sn solder or the like. Thus, in variation 1, an inside of the substrate part 23 and the dam part 24 is gas-tightly sealed by a glass window and the lid body 29.

Figure 7:
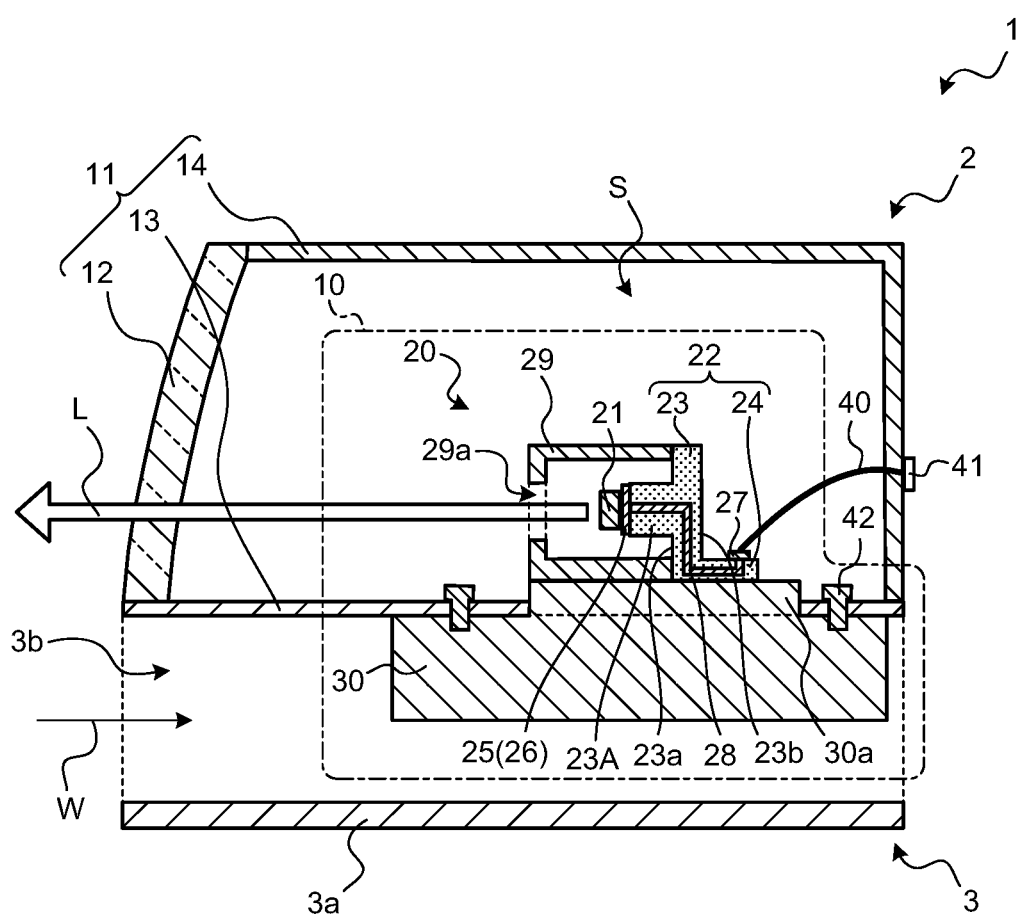
FIG. 7 is a cross-sectional view of a lighting device for a vehicle according to variation 2 of an embodiment.

FIG. 7 is a cross-sectional view of a lighting device for a vehicle 1 according to variation 2 of an embodiment. In variation 2 as illustrated in FIG. 7, structures of a substrate for mounting an element 22 and a lid body 29 are different from those of variation 1. In the substrate for mounting an element 22 according to variation 2, a dam part 24 is shortened on a back side thereof and the lid body 29 is provided on a site where such a dam part 24 is shortened. That is, the lid body 29 in variation 2 is of a rectangular shape where four sides thereof are plugged in a cross-sectional view thereof.

Even in such a configuration, a light-emitting element 21 is mounted on a base 23A that is provided on a side of a front surface 23a of a substrate part 23 and a heat release member 30 is provided on a side of a side surface of the dam part 24, similarly to variation 1, so that it is possible to release heat that is generated from the light-emitting element 21 that is a heat generation part, through the dam part 24.

Figure 8:
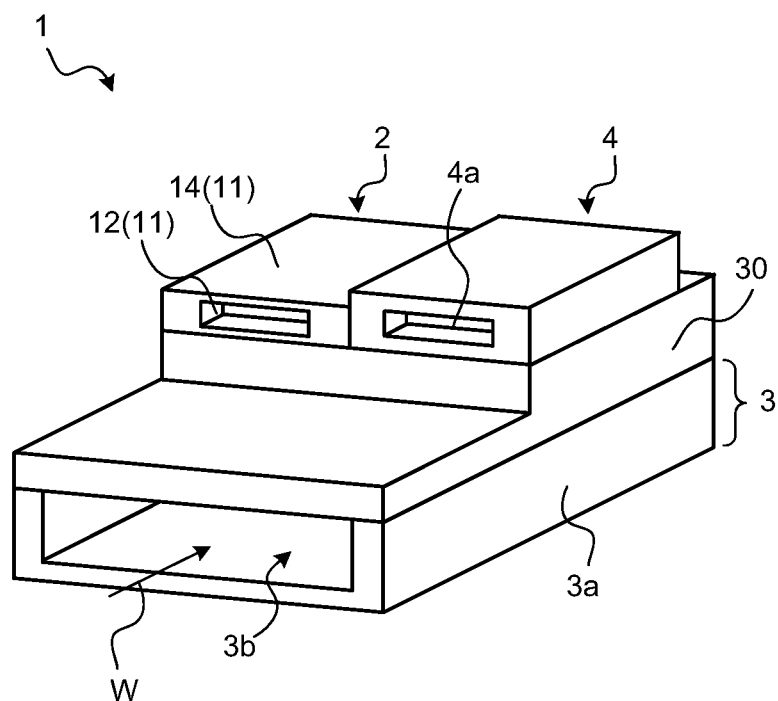
FIG. 8 is a perspective view of a lighting device for a vehicle according to variation 3 of an embodiment.

FIG. 8 is a perspective view of a lighting device for a vehicle 1 according to variation 3 of an embodiment. As illustrated in FIG. 8, In the lighting device for a vehicle 1 according to variation 3, a LIDAR (Light Detection and Ranging) sensor 4 in addition to a lighting device body 2 is provided on a heat release member 30.

For example, as illustrated in FIG. 8, a detection part 4a of the LIDAR sensor 4 is arranged so as to be oriented in a direction that is identical to that of a translucent member 12. Thereby, in the lighting device for a vehicle 1 according to variation 3, it is possible for a lighting device body 2 to emit light L in a predetermined direction (for example, on a front side of a vehicle 100) and it is possible for the LIDAR sensor 4 to detect a position of an object that is present in the predetermined direction.

Then, in variation 3, the LIDAR sensor 4 is mounted on the heat release member 30, so that it is possible to maintain a heat release property of the LIDAR sensor 4 in a stabilized state thereof, by wind W that passes through a ventilation part 3 at a time of travel of the vehicle 100. Therefore, according to variation 3, it is possible to operate the LIDAR sensor 4 stably.

Although an embodiment(s) of the present invention has/have been explained above, the present invention is not limited to the embodiment(s) as described above and various modifications are possible without departing from a spirit thereof. For example, in an embodiment(s) as described above, a thermoelectric element may be placed on an upper surface of a lid body 29.

Thus, a thermoelectric element is placed on an upper surface of the lid body 29 that is present near a light-emitting element 21, so that it is possible to execute temperature control of the light-emitting element 21 with a high accuracy. Moreover, a thermoelectric element is provided on an opposite side of a heat release member 30, so that it is possible to prevent or reduce decreasing of a region that is occupied by the heat release member and hence it is possible to maintain a high heat release property thereof.

Furthermore, although an example where the ventilation part 3 is provided on a lower side of the lighting device body 2 is illustrated in an embodiment(s) as described above, the ventilation part 3 may be provided on a lateral side of the lighting device body 2 or may be provided on an upper side of the lighting device body 2.

Furthermore, although an example where the lighting device for a vehicle 1 is provided on a front side of the vehicle 100 is illustrated in an embodiment(s) as described above, the lighting device for a vehicle 1 may be provided on a rear side of the vehicle 100 or may be provided on a lateral side of the vehicle 100. In such a case, it is sufficient that a duct or the like that incorporates wind W into the ventilation path 3b of the ventilation part 3 in association with travel of the vehicle 100 is separately provided in the vehicle 100.

Furthermore, although an example where the terminal for an electrical power source 27 and/or another terminal for an electrical power source is/are provided on the front surface 23a of the substrate part 23 is illustrated in an embodiment(s) as described above, a position(s) where the terminal for an electrical power source 27 and/or another terminal for an electrical power source is/are provided is/are not limited to the front surface 23a of the substrate part 23 and it is sufficient that it/they is/are provided on a surface of the substrate for mounting an element 22.

As described above, a lighting device for a vehicle 1 according to an embodiment includes a lighting device body 2 that has a light source part 10 and a housing body 11 that supports the light source part 10, and a ventilation part 3 that is provided so as to be adjacent to the lighting device body 2 and passes wind W from an outside therethrough. The light source part 10 has a light source element part 20 that emits light L and a heat release member 30 that releases heat that is generated in the light source element part 20. The light source element part 20 is provided on an inside of the housing body 11, and the heat release member 30 is provided so as to be exposed to an inside of the ventilation part 3. Thereby, it is possible to reduce an amount of consumption of electric power that is stored in a vehicle 100.

Furthermore, in the lighting device for a vehicle 1 according an embodiment, the light source element part 20 has a light-emitting element 21 that emits light L, and a substrate for mounting an element 22 where a mounting part 25 that mounts the light-emitting element 21 thereon is provided. The substrate for mounting an element 22 has a substrate part 23 with a flat plate shape where the mounting part 25 is provided on a front surface 23a thereof, and a dam part 24 that is provided so as to surround the mounting part 25. The dam part 24 has an opening part 24a in a direction where the light-emitting element 21 emits light L, and the heat release member 30 is provided on a back surface 23b of the substrate part 23. Thereby, it is possible to improve a heat release property of a light source part 10.

Furthermore, in the lighting device for a vehicle 1 according to an embodiment, a volume of the heat release member 30 is greater than a volume of the substrate for mounting an element 22. Thereby, it is possible to further improve a heat release property of a light source part 10.

Furthermore, in the lighting device for a vehicle 1 according to an embodiment, the housing body 11 has a support member 13 that supports the light source part 10 and a housing member 14, the heat release member 30 is fixed on the support member 13, and the substrate for mounting an element 22 is fixed on the heat release member 30. Thereby, it is possible to prevent or reduce a positional shift between a substrate for mounting an element 22 and a heat release member 30 or the like, so that it is possible to decrease a dispersion of a direction of light L that is emitted.

Furthermore, in the lighting device for a vehicle 1 according to an embodiment, the heat release member 30 has a base material part 31 and a protrusion part 32, and the protrusion part is one of a needle point holder type where a plurality of columnar bodies 33 are arrayed and a parallel wall type where a plurality of wall members 34 are arrayed. Thereby, it is possible to increase a surface area of a heat release member 30, so that it is possible to improve a heat release property of the heat release member 30.

Furthermore, in the lighting device for a vehicle 1 according to an embodiment, the protrusion part 32 is the parallel wall type, and the wall members 34 are provided on the ventilation part 3 so as to be along a direction where wind W flows. Thereby, it is possible to provide a smooth flow of wind W on a ventilation path 3b, so that it is possible to further improve a heat release property of a heat release member 30.

Furthermore, the lighting device for a vehicle 1 according to an embodiment further includes a LIDAR (Light Detection and Ranging) sensor 4 that is provided on the heat release member 30 so as to be adjacent to the lighting device body 2. Thereby, it is possible to operate a LIDAR sensor 4 stably.

Furthermore a vehicle 100 according to an embodiment includes the lighting device for a vehicle 1 as described above. Thereby, it is possible to reduce an amount of consumption of electric power that is stored in a vehicle 100.

It is possible for a person(s) skilled in the art to readily derive an additional effect(s) and/or (an)other aspect(s). Hence, a broader aspect(s) of the present invention is/are not limited to a specific detail(s) and a representative embodiment(s) as illustrated and described above. Therefore, various modifications are possible without departing from the spirit or scope of a general inventive concept that is defined by the appended claim(s) and an equivalent(s) thereof.

REFERENCE SIGNS LIST 1 lighting device for a vehicle
2 lighting device body
3 ventilation part
4 LIDAR sensor
10 light source part
11 housing body
12 translucent member
13 support member
14 housing member
20 light source element part
21 light-emitting element
22 substrate for mounting an element
23 substrate part
23a front surface
23b back surface
24 dam part
24a opening part
25 mounting part
26 terminal for an element
30 heat release member
31 base material part
32 protrusion part
33 columnar body
34 wall member
100 vehicle

The invention claimed is:

1. A lighting device for a vehicle comprising:
a lighting device body that has a light source part and a housing body having a support member that supports the light source part; and
a ventilation part adjacent to the lighting device body and through which outside wind passes, wherein
the light source part has a light source element part that emits light and a heat release member that releases heat that is generated in the light source element part,
the light source element part is inside of the housing body,
the heat release member is fixed on the support member and exposed inside of the ventilation part,
the heat release member has a protrusion part on a side of an upper surface thereof, the protrusion part having a convex shape, and
the light source element part is attached to the protrusion part of the heat release member,
wherein the heat release member is arranged in such a manner that a site other than the protrusion part contacts a lower surface of the support member and the heat release member and the support member are fixed by a fixation member.

2. The lighting device for a vehicle according to claim 1, wherein
the light source element part has a light-emitting element that emits light, and an element mounting substrate having a mounting part for mounting the light-emitting element,
the element mounting substrate has a substrate part with a flat plate shape where the mounting part is provided on a front surface, and a dam part that surrounds the mounting part,
the dam part has an opening part in a direction where the light-emitting element emits light, and
the heat release member is on a back surface of the substrate part.

3. The lighting device for a vehicle according to claim 2, wherein
a volume of the heat release member is greater than a volume of the element mounting substrate.

4. The lighting device for a vehicle according to claim 2, wherein
the housing body has a support member that supports the light source part and a housing member,
the heat release member is fixed on the support member, and
the element mounting substrate is fixed on the heat release member.

5. The lighting device for a vehicle according to claim 1, wherein
the protrusion part is one of a needle point holder type where a plurality of columnar bodies are arrayed and a parallel wall type where a plurality of wall members are arrayed.

6. The lighting device for a vehicle according to claim 5, wherein
the protrusion part is the parallel wall type, and
the plurality of wall members is on the ventilation part to be along a direction where wind flows.

7. The lighting device for a vehicle according to claim 1, further comprising:
a LIDAR (Light Detection and Ranging) sensor that is on the heat release member adjacent to the lighting device body.

8. A vehicle comprising:
the lighting device for a vehicle according to claim 1.

* * * * *